(12) United States Patent
Abe et al.

(10) Patent No.: US 6,899,758 B2
(45) Date of Patent: May 31, 2005

(54) METHOD AND APPARATUS FOR GROWING SINGLE CRYSTAL

(75) Inventors: Takao Abe, Gunma (JP); Toru Yamada, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 69 days.

(21) Appl. No.: 10/203,825

(22) PCT Filed: Dec. 26, 2001

(86) PCT No.: PCT/JP01/11491

§ 371 (c)(1),
(2), (4) Date: Aug. 13, 2002

(87) PCT Pub. No.: WO02/053811

PCT Pub. Date: Jul. 11, 2002

(65) Prior Publication Data

US 2003/0010276 A1 Jan. 16, 2003

(30) Foreign Application Priority Data

Dec. 28, 2000 (JP) .................................... 2000-401648

(51) Int. Cl.[7] ............................................. C30B 15/20
(52) U.S. Cl. ........................ 117/13; 117/34; 117/208; 117/217; 117/935
(58) Field of Search ........................ 117/13, 34, 435, 117/217, 208

(56) References Cited

U.S. PATENT DOCUMENTS 5,567,399 A * 10/1996 Von Ammon et al. ... 422/245.1
6,036,776 A * 3/2000 Kotooka et al. ............ 117/217
6,117,402 A * 9/2000 Kotooka et al. .......... 422/245.1
2001/0055689 A1 * 12/2001 Park ............................ 428/446

FOREIGN PATENT DOCUMENTS

| JP | 63-285187 | 11/1988 |
| JP | 02-097481 | 4/1990 |
| JP | 06-211589 | 8/1994 |
| JP | 08-239291 | 9/1996 |

OTHER PUBLICATIONS

F. Dupret et al., "Global Modelling of Heat Transfer in Crystal Growth Furnaces", Int. J. Heat Mass Transfer, vol. 33, No. 9, pp. 1849–1871, 1990.

* cited by examiner

*Primary Examiner*—Robert Kunemund
(74) *Attorney, Agent, or Firm*—Hogan & Hartson, LLP

(57) ABSTRACT

The present invention provides a method and apparatus for growing a single crystal by the Czochralski method, wherein a single crystal is grown with forced cooling of neighborhood of a crystal growth interface by disposing a cooling cylinder formed of copper or a metal having a heat conductivity larger than that of copper at least in the vicinity of the crystal growth interface so as to surround the single crystal under pulling and circulating a cooling medium in the cooling cylinder. Thus, there are provided a method and apparatus for growing a single crystal, which can exert cooling effect on a growing single crystal to the maximum extent so as to realize higher crystal growth rate, even when a silicon single crystal having a diameter of 300 mm or more is grown.

15 Claims, 6 Drawing Sheets

(a)

(b)

F I G. 6
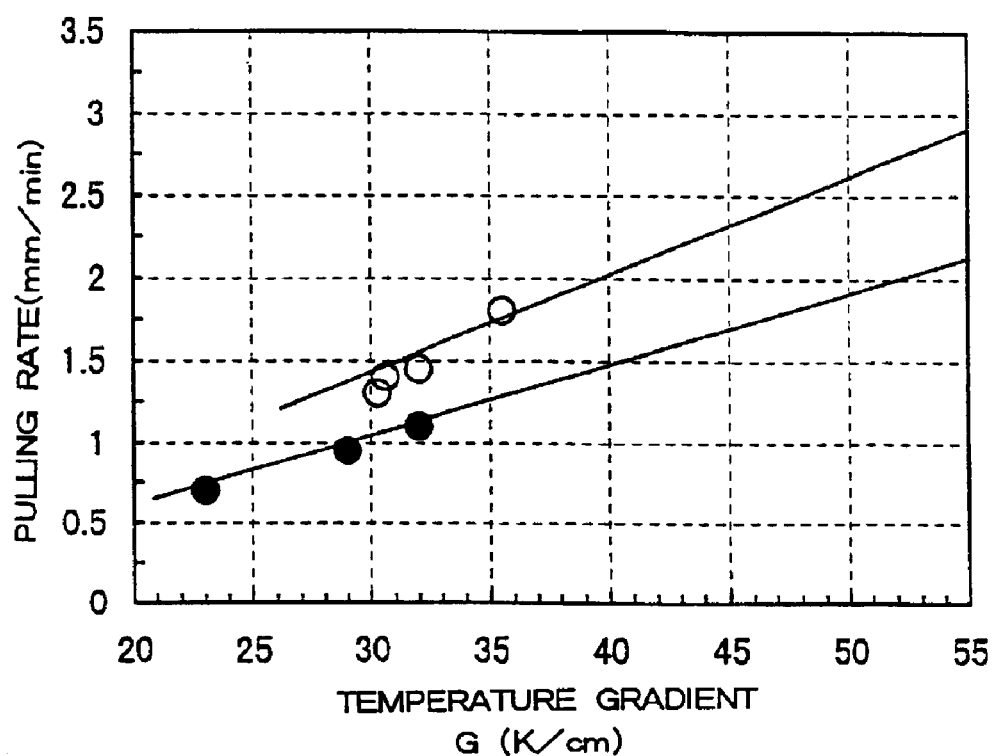

METHOD AND APPARATUS FOR GROWING SINGLE CRYSTAL

TECHNICAL FIELD

The present invention relates to a method for growing a single crystal and apparatus for growing a single crystal used for production of single crystals such as silicon single crystals by the Czochralski method (also referred to as the "CZ method" or "pulling method" hereinafter).

BACKGROUND ART

Hereafter, conventional art relating to the present invention will be explained by exemplifying growing of a silicon single crystal.

An apparatus for growing a single crystal used for producing a silicon single crystal by the CZ method generally comprises a crucible containing a raw material melt, which can be moved upwardly and downwardly, and a heater disposed so as to surround the crucible, both of which are provided in a main chamber for growing a single crystal, and a pulling chamber for containing and taking out a grown single crystal is continuously provided above the main chamber. When a single crystal is produced by using such an apparatus for growing a single crystal, a seed crystal is immersed into the raw material melt and carefully pulled upwardly with rotation to grow a rod-like single crystal, while the crucible is moved upwardly according to the growth of the crystal so that the melt surface should be always maintained at a constant height in order to obtain desired crystal quality.

Further, when the single crystal is grown, the seed crystal attached to a seed holder is immersed into the raw material melt, and then the seed crystal is pulled upwardly with rotation in a desired direction by carefully winding up a wire by means of a pulling mechanism to grow a single crystal ingot at the end of the seed crystal. In this case, in order to eliminate dislocations generated when the seed crystal is brought into contact with the melt, the crystal in an early stage of the growth is once made thin to a small diameter of about 3 to 5 mm, and then the diameter is increased after the dislocation are eliminated so as to grow a single crystal ingot of desired quality.

At this time, the pulling rate for a portion having a constant diameter of the single crystal ingot is usually extremely slow, i.e., about 0.5 to 1 mm/min, and if it is pulled fast by constraint, there are arisen various problems. For example, the growing single crystal is deformed and thus a cylindrical product having a constant diameter can no longer be obtained, slip dislocations are generated in the single crystal ingot, the crystal is detached from the melt and thus it cannot be a product and so forth. Therefore, increase of the crystal growth rate is limited.

However, for the purpose of improving productivity and reducing cost in the production of single crystal ingots by the aforementioned CZ method, increase of the single crystal growth rate is the most effective means, and various improvement have hitherto been made to achieve increase of the single crystal growth rate.

The pulling rate, i.e., the single crystal growth rate, is determined by the heat balance of the growing crystal. The heat quantity incorporated into the crystal consists of inflow heat quantity from the melt and the heater and solidification latent heat generated when the melt crystallizes. When the heat balance of the growing crystal is considered, it is necessary that outflow heat quantity emitted out of the crystal from the crystal surface and through the seed crystal should be equal to the sum of the inflow heat quantity and the solidification latent heat. The solidification latent heat depends on the volume of the crystal growing per unit time. Therefore, in order to increase the crystal growth rate, it is necessary to compensate increase of solidification latent heat provided by increase of the crystal growth rate by reducing the inflow heat quantity or increasing the outflow heat quantity.

Therefore, it is generally used a method of efficiently removing heat emitted from the crystal surface to increase the outflow heat quantity.

As one of such means, there were proposed apparatuses in which the pulling rate is increased by providing cooling means in the main chamber so as to surround a single crystal ingot under pulling and thereby efficiently cooling the single crystal ingot under pulling. For example, there is the apparatus disclosed in Japanese Patent Laid-open (Kokai) Publication No. 6-211589. In this apparatus, a gas flow guide cooling cylinder having a double structure consisting of an outer cooling cylinder composed of metal and an inner cooling cylinder composed of graphite or the like is provided from the bottom portion of the pulling chamber to the inside of the main chamber so as to concentrically surround a single crystal ingot under pulling and thereby heat generated in the inner cooling cylinder is transferred to the outside by the outer cooling cylinder, so that temperature increase of the inner cooling cylinder should be suppressed and cooling efficiency of the crystal should be improved.

Apparatuses utilizing a cooling medium such as water in order to more efficiently cool a growing single crystal are also disclosed. For example, in the apparatus for growing a single crystal disclosed in Japanese Patent Laid-open (Kokai) Publication No. 8-239291, a cooling duct for circulating a liquid refrigerant is provided in a main chamber and a cooling member composed of a material having high heat conductivity such as silver is provided below the duct so as to rapidly transfer heat emitted from crystal surface to the outside and thereby attain effective cooling of the crystal. However, if fluid such as water generally used as the cooling medium become close to the melt surface heated to a high temperature exceeding 1000° C., it may be a cause of phreatic explosion and thus dangerous. Therefore, in this apparatus, safety is secured by separating the cooling duct from the melt surface.

However, in these days, the diameter of silicon wafers became larger and, in particular, mass production of silicon wafers having a diameter of 300 mm is contemplated. Thus, it has become clear that cooling of the crystals become insufficient even when such cooling structures as mentioned above are used and thus it is difficult to use further higher crystal growth rate, so that decrease of productivity of crystals is invited.

That is, it was found that there was a problem as described below. That is, such a cooling structure as disclosed in Japanese Patent Laid-open (Kokai) Publication No. 8-239291 can provide a certain degree of cooling effect, because a cooling member having high heat conductivity can be brought close to the melt surface of silicon. However, a restriction is imposed on the apparatus that a cooling duct for circulating a liquid refrigerant for cooling the cooling member must be sufficiently separated from the melt surface so that it should not be brought into contact with the melt surface when the crucible containing the melt is elevated to the maximum height that the crucible can reach, due to the problem concerning the safety described above. Therefore, there is caused a problem that the cooling effect provided by the cooling medium is unlikely to reach the end of the cooling member.

DISCLOSURE OF THE INVENTION

The present invention was accomplished in view of the aforementioned problem, and an object of the present invention is to provide a method for growing a single crystal and apparatus for growing a single crystal that can exert cooling effect on a growing single crystal to the maximum extent so as to realize higher crystal growth rate, even when a silicon single crystal having a diameter of 300 mm or more is grown.

In order to attain the aforementioned object, the method for growing a single crystal of the present invention is a method for growing a single crystal by the Czochralski method, wherein a single crystal is grown with forced cooling of neighborhood of a crystal growth interface by disposing a cooling cylinder formed of copper or a metal having a heat conductivity larger than that of copper at least in the vicinity of the crystal growth interface so as to surround the single crystal under pulling and circulating a cooling medium in the cooling cylinder.

By disposing a cooling cylinder formed of copper or a metal having a heat conductivity larger than that of copper, which has high heat resistance and high heat conductivity, and forcibly cooled by the circulation of the cooling medium in the neighborhood immediately above the liquid-solid growing interface of the single crystal near the raw material melt to forcibly cool neighborhood of the crystal growth interface, the single crystal pulled from the raw material melt and having an extremely high temperature is shielded from the radiant heat from a heater and heat from the single crystal is rapidly absorbed. Therefore, the growth rate of the crystal can be markedly accelerated.

In the above method, the single crystal is preferably pulled with adjusting a position of the melt surface so that Distance A (mm) between a lower end of the cooling cylinder and the raw material melt surface and Distance B (mm) between a lower end of the cooling medium circulating in the cooling cylinder and the raw material melt surface should satisfy a relationship of $100 \geq B \geq A \geq 5$. Further, it is more preferred that Distance A and Distance B should satisfy a relationship of $B-A \leq 50$.

By disposing the lower end of the cooling cylinder and the lower end of the cooling medium in the cooling cylinder with securing predetermined distances from the raw material melt surface as described above, the cooling cylinder and the cooling medium can be brought close to the melt surface without contact with the melt, and thus the growing single crystal can be cooled efficiently and safely. Therefore, a single crystal of large size having a diameter exceeding 300 mm can be grown at a high speed, and thus the productivity and yield can be improved.

The apparatus for growing a single crystal of the present invention is an apparatus for growing a single crystal based on the Czochralski method comprising at least a main chamber enclosing a crucible for containing a raw material melt and a heater for heating the raw material melt, a pulling chamber continuously provided above the main chamber, into which a grown single crystal is pulled and stored, and a cooling cylinder surrounding the single crystal under pulling, wherein at least the cooling cylinder is composed of copper or a metal having a heat conductivity larger than that of copper, is forcibly cooled by circulation of a cooling medium, and extends from an upper portion of the main chamber toward a raw material melt surface so as to cool neighborhood of a crystal growth interface.

If the structure of the apparatus for growing a single crystal described above is used, the growing single crystal can be forcibly cooled efficiently and rapidly in the vicinity of the crystal growth interface. Therefore, the growth rate of the crystal can be increased, and the productivity and yield of the single crystal production can be improved.

Because the material of the cooling cylinder, copper or a metal having a heat conductivity larger than that of copper, for example, silver, copper-silver alloy etc., is extremely excellent in heat resistance and shows extremely high heat conductivity, the radiant heat from the melt and heater is effectively shielded, and surface temperature of the cooling cylinder formed of copper or the like becomes low if it is forcibly cooled with a cooling medium. Therefore, it is suitable for cooling a single crystal ingot at an extremely high temperature immediately after the pulling from the melt surface.

In the above apparatus, the cooling cylinder may have a hollow structure for circulation of the cooling medium, or it may consist of a solid cooling cylinder wound with a cooling pipe for circulation of the cooling medium. Further, as the cooling medium, water is preferably used.

If there is used a cooling cylinder structure of so-called jacket structure provided with a box-shaped cylindrical hollow or so-called coil structure in which the cylinder is formed with a single solid plate and a cooling pipe is wound around it, and water available at a low cost and showing high heat conductivity and no corrosive property is used as the cooling medium circulating in the cooling cylinder of hollow structure or the cooling pipe, the radiant heat from the heater and the melt surface and the outflow heat emitted from the growing crystal can be absorbed, and thus the growing single crystal can be efficiently cooled.

In this case, the cooling cylinder and so forth are preferably disposed so that Distance A (mm) between the lower end of the cooling cylinder and the raw material melt surface and Distance B (mm) between a lower end of the cooling medium circulating in the cooling cylinder and the raw material melt surface should satisfy the relationship of $100 \geq B \geq A \geq 5$ during pulling of the crystal. Further, it is more preferred that Distance A and Distance B should satisfy the relationship of $B-A \leq 50$.

If the lower end of the cooling cylinder and the lower end of the cooling medium in the cooling cylinder are disposed with securing predetermined distances satisfying said relationship from the raw material melt surface as described above, the growing single crystal can be cooled by the cooling cylinder efficiently and safely. Therefore, the apparatus can be an apparatus that can grow a single crystal of large size having a diameter exceeding 300 mm with extremely high productivity due to higher growth rate.

As explained above, the method for growing a single crystal and apparatus for growing a single crystal of the present invention are characterized in that a single crystal is grown with forced cooling of neighborhood of a crystal growth interface by disposing a cooling cylinder formed of copper or a metal having a heat conductivity larger than that of copper at least in the vicinity of the crystal growth interface so as to surround a growing single crystal and circulating a cooling medium in the cooling cylinder. Because of this characteristic, the cooling effect for the crystal can be exerted to the maximum extent, and thus the pulling rate can be increased to drastically increase the productivity of the crystal. Further, because a metal such as copper showing excellent heat resistance and high heat conductivity is used as the material of the cooling cylinder, which is forcibly cooled with the cooling medium, the cooling cylinder is free from a fear of corrosion or breakage even when it is brought into contact with the melt at an extremely high temperature and thus protected. Therefore, a further higher level of safety is secured.

BRIEF EXPLANATION OF THE DRAWINGS

FIG. 6 is a graph showing relationship between temperature gradient G and maximum pulling rate for a case of pulling a crystal having a diameter of 8 inches.

BEST MODE FOR CARRYING OUT THE INVENTION

Hereafter, the present invention will be explained in detail. However, the present invention is not limited to the following explanations.

In order to increase the rate of crystal growth by the Czochralski method, it is necessary to efficiently cool a crystal under pulling. Therefore, as proposed in the aforementioned Japanese Patent Laid-open (Kokai) Publication Nos. 6-211589 and 8-239291, it is effective to use an apparatus for growing a single crystal provided with cooling means so as to surround a single crystal ingot under pulling in a main chamber. However, for example, if a cooling pipe for circulating a cooling medium used for cooling means such as cooling water is broken and the cooling water is leaked and fallen onto the raw material melt surface at a high temperature, it may be a cause of phreatic explosion and thus dangerous. Therefore, it has been a common knowledge for those skilled in the art that such a cooling pipe must be disposed at a position as remoter as possible from the silicon melt surface to secure safety. Specifically, as disclosed in Japanese Patent Laid-open (Kokai) Publication No. 8-239291, the cooling pipe for circulating the cooling medium is disposed so that it cannot be brought into contact with the raw material melt even if the crucible is accidentally elevated to the maximum height.

However, as the cooling pipe becomes remoter from the raw material melt as described above, cooling effect for the crystal under pulling is decreased, and thus it constitutes a factor inhibiting use of a higher crystal growth rate. On the other hand, it is recognized by those skilled in the art that it is practically impossible to increase the cooling effect by bringing the cooling means further closer to the raw material melt from the distance used in the conventional apparatuses because of the aforementioned problem concerning safety.

Therefore, the inventors of the present invention carried out the experiments described hereinafter in order to solve the problem concerning safety and find out means drastically improving the cooling effect, and obtained a novel finding that if a material having high heat conductivity such as copper is used for a cooling pipe for circulating the cooling medium, the cooling pipe can retain the cooling medium without breakage or melting thereof even if the cooling pipe is brought into contact with the raw material melt at a high temperature, that is, it becomes possible to make the cooling medium and the raw material melt closer extremely safely. Thus, they accomplished the present invention.

(Experiment 1)

Figure 3:
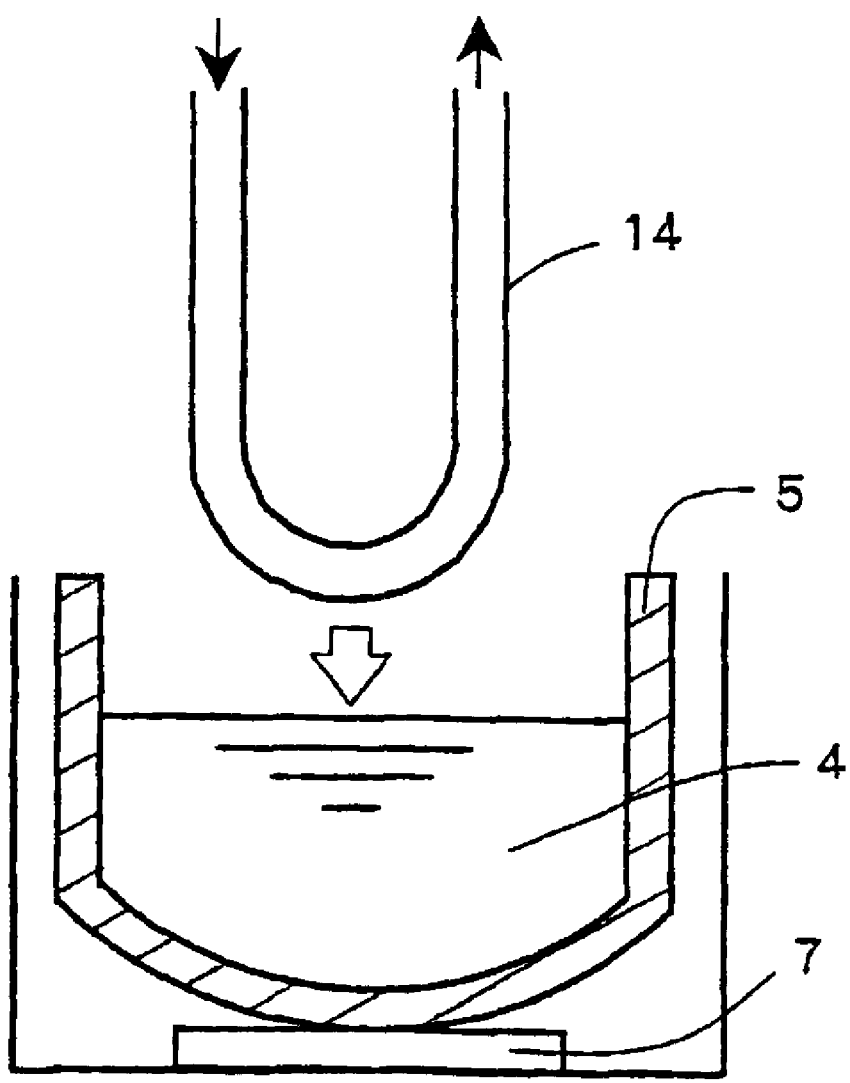
FIG. 3 is a schematic explanatory view showing an experimental apparatus used in the present invention.

A U-shaped copper pipe 14 (outer diameter: 8 mm, wall thickness: 0.8 mm) and a small size quartz crucible 5 (inner diameter: 48 mm, provided with a heater at bottom) as shown in FIG. 3 were prepared.

First, in consideration of safety, a preliminary experiment was performed by using SiGe (Si: 1 weight %, solidification point: about 1050° C.), which had a melting point lower than that of silicon, as the melt raw material. An amount of 200 g of this SiGe was introduced into the quartz crucible 5, and the raw material was melt with maintaining the temperature of the heater 7 at the bottom of the crucible 5 at 1222° C. Water was flown (4.7 L/min) in the U-shaped copper pipe 14, and the water-cooled copper pipe 14 was immersed into the raw material melt 4. As a result, even if the water-cooled copper pipe 14 was brought into contact with the SiGe melt, it was not melted at all (melting point of copper: 1083° C.) and, to the contrary, there was observed a phenomenon that the SiGe melt around the water-cooled copper pipe 14 was solidified.

Thus, safety to a certain extent was confirmed, because the water-cooled copper pipe was not melted even when it was immersed in the melt having a temperature higher than the melting point of copper. Therefore, the raw material was then changed to silicon (Si, solidification point: about 1420° C.). The raw material was melted while maintaining the temperature of the heater 7 at the bottom of the crucible at 1540° C., and an experiment similar to the above was performed. As a result, in spite of immersion of the water-cooled copper pipe into the silicon melt at a high temperature of 1420° C. or higher for 3 minutes, only solidification of Si around the copper pipe was observed, and the copper pipe was not eroded by the melted silicon at all, although the outlet temperature of the cooling water rose from 25° C. to 28° C.

In addition, when the surface of the copper pipe was examined after the immersion experiment into the silicon melt, it was found that scratches generated when the copper pipe was bent into the U-shape remained as they were. That is, it was confirmed that the melted silicon was solidified without reacting with the copper pipe at all.

The above results can be interpreted as follows. For melting of the copper pipe, the surface temperature must reach 10830° C., which is the melting point of copper. However, considering that the temperature of the internal surface should be 100° C. or lower (25–280° C.) because of the water cooling of the internal surface, there must be a temperature difference of about 1000 in the wall thickness of 0.8 mm. Since the temperature gradient in this case should be $1.25 \times 10^6$ K/m, there must be a heat flow rate of $5.0 \times 10^8$ W/m$^2$, which is obtained by multiplying the temperature gradient by the heat conductivity of copper at 0° C., 401 W/mK. In order that the silicon melt can supply this heat flow rate to the copper pipe, there must be generated a temperature gradient of $1.25 \times 10^7$ K/m, which is obtained by dividing the heat flow rate by the heat conductivity of the melt, that is, there must be a temperature gradient of 12500

K per mm for a portion of the silicon melt contacting the copper pipe. Although such a status may mathematically exist for an extremely short time upon contact, it does not exist continuously. Therefore, it can be substantially ignored, and the solidification of silicon starts immediately. Accordingly, it is considered that the water-cooled copper pipe is not changed at all.

On the other hand, because stainless steel (e.g., SUS316L (JIS Standard)), which is generally used for cooling cylinders of currently used apparatuses for growing a single crystal, has a low heat conductivity (16 W/mK at 20° C.) lower than $1/10$ of that of copper, its surface temperature is likely to increase when it is brought into contact with the raw material melt. In addition, since welding portions must be used at positions applied with thermal stress due to the structure of the cooling cylinder, reliability becomes low. In this connection, since copper also has the characteristic of ductility, it is unlikely to generate cracks even if thermal stress is applied, and therefore it is considered a material suitable for the cooling cylinder. Further, it is also possible to constitute the cooling cylinder by a method of winding a copper pipe around a copper plate in a cylindrical shape and fixing it by silver soldering. Since the copper surface has a temperature of 100° C. or lower, contamination with copper from the surface is improbable.

(Experiment 2)

Figure 4:
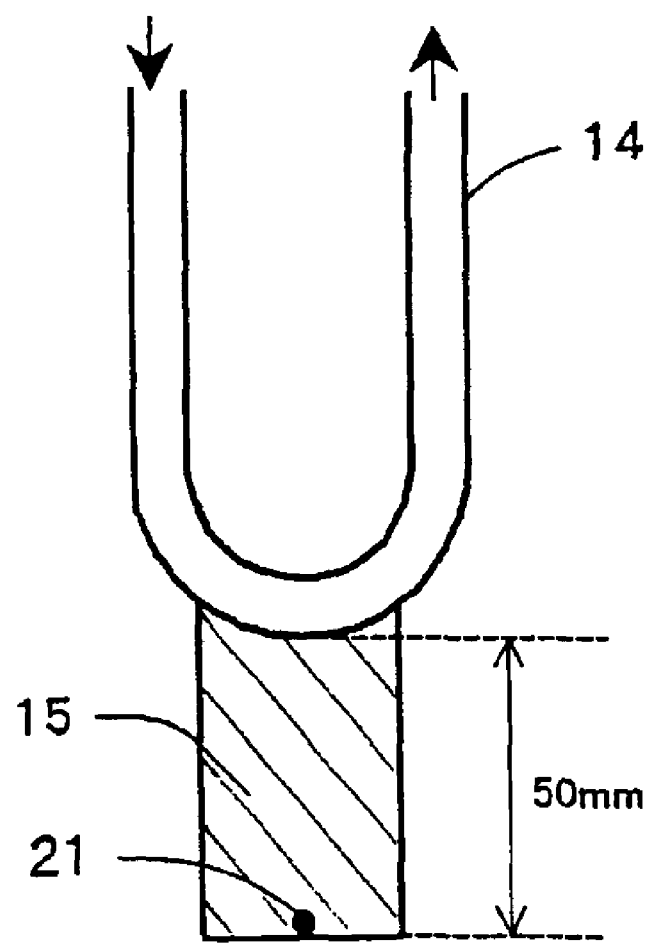
FIG. 4 is a schematic explanatory view showing another embodiment of an experimental apparatus used in the present invention.

Then, in order to confirm effect of water cooling by a water-cooled copper pipe, a copper plate 15 (length: 50 mm, width: 20 mm, thickness: 2 mm) was welded at an end of a water-cooled copper pipe 14 the same as that of the experimental example 1 by using silver solder as shown in FIG. 4, and an experiment was performed in which the copper plate portion was immersed into a silicon melt. A thermocouple 21 was provided at the lower end of the copper plate 15 so as to enable temperature measurement.

The flow rate of cooling water was set to be 6.6 L/min, and the temperature of the silicon melt was adjusted to 1520° C., which was higher than the melting point by 100° C. In this state, the temperature of the lower end of the copper plate 15 located about 4 cm above the melt surface became 465° C. When the copper plate 15 was descended from the above position and brought into contact with the silicon melt 4, the contacting portion was heated slowly to redness and melted soon. Then, the copper plate 15 was once separated from the melt, the temperature of the melt was lowered by 50° C. to a temperature higher than the melting point by 50° C. (1470° C.), and then the copper plate 15 was descended again and brought into contact with the silicon melt 4. At this time, silicon of the contacting position was solidified.

Further, the copper plate was changed to a stainless steel plate (SUS316L), and the temperature of the lower end of the stainless steel plate located 4 cm above of the surface of the silicon melt at 1470° C. was measured. The temperature was 905° C. When the stainless steel plate was descended and brought into contact with the silicon melt under the same conditions, the contacting portion emitted a white light and was instantly melted. Furthermore, when the shortened stainless steel plate was again brought into contact with the silicon melt, the contacting portion again emitted a white light and was melted instantly. The same phenomenon was observed even when the length of the stainless steel plate was shortened by about 30 mm and the end became closer to the water-cooled copper pipe.

Based on the results of the above experiment, it was found that, in the case of copper, temperature increase was significantly suppressed even at a position of about 5 cm from the water-cooled portion, and copper was not melted if the temperature of the silicon melt was higher than the melting point by about 50° C. Therefore, when the cooling cylinder is produced with copper, sufficient cooling effect can be obtained even with a structure comprising a copper plate rolled into a cylindrical shape and wound with a water-cooled copper pipe on the outside, and a safe cooling cylinder can be obtained, which does not cause melting of copper even if the cooling cylinder is accidentally immersed into a melt. This can also be applied to silver, alloy of silver and copper and so forth, which have a heat conductivity larger than that of copper.

Further, since stainless steel emitted a white light and was melted instantly in the aforementioned experiment, it is presumed that stainless steel caused an exothermic reaction upon melting. If an exothermic reaction is caused, the reaction of only a small portion accelerates reaction of surrounding portion and therefore the reaction proceed explosively. It is dangerous to use such a material as a material of a portion that may be brought into contact with a silicon melt. In this regard, copper does not suffer from such danger as is understood from the fact that it was calmly melted in silicon, and thus it can be considered a suitable material also in view of reactivity.

Hereafter, the present invention will be specifically explained by exemplifying growth of silicon single crystals with reference to the appended drawings. However, the present invention is not limited only to growth of these silicon single crystals. For example, the apparatus of the present invention can be also used for growth of other single crystals such as those of compound semiconductors.

Figure 1:
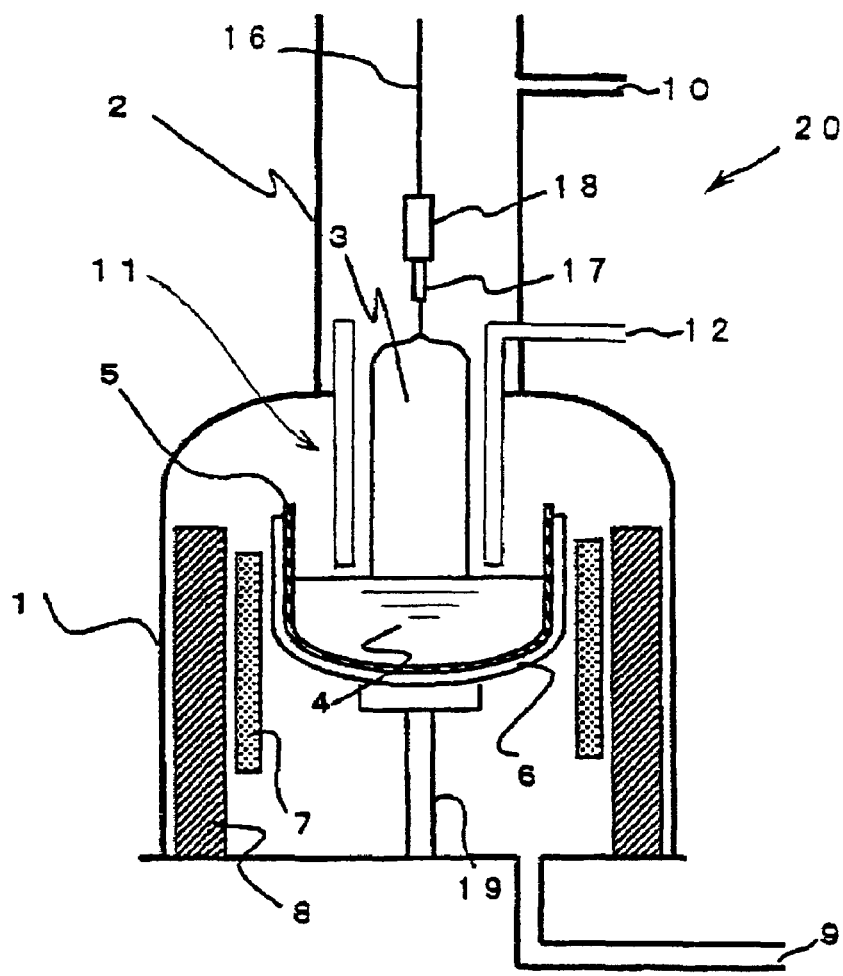
FIG. 1 is an explanatory view showing a schematic structure of an exemplary apparatus for growing a single crystal according to the present invention: (a) sectional view, and (b) details around cooling cylinder.
Figure 1:
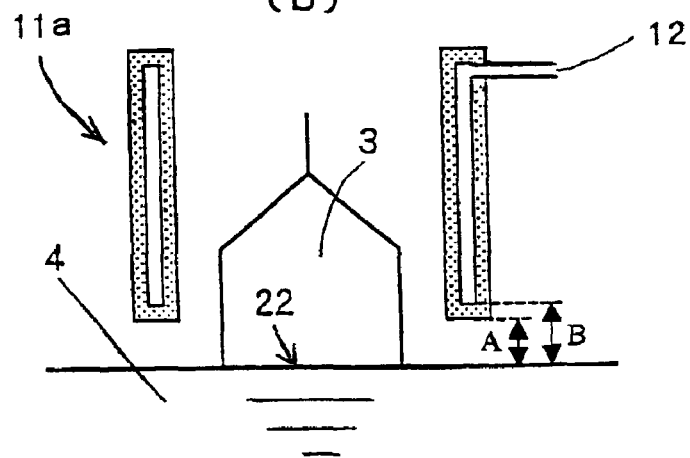

FIG. 1 is a sectional view showing a schematic structure of an exemplary apparatus for growing a single crystal according to the present invention.

In the apparatus 20 for growing a single crystal shown in FIGS. 1(a) and (b), a crucible 5 for containing a raw material such as polycrystal silocon melt 4, a heater 7 for heating and melting the polycrystal silicon raw material and so forth are contained in a main chamber 1, and on top of a pulling chamber 2 continuously provided on the main chamber 1, a pulling mechanism (not shown) for pulling a grown single crystal is provided.

From the pulling mechanism provided above the pulling chamber 2, a pulling wire 16 is reeled out, and a seed holder 18 for attaching a seed crystal 17 is connected at the end of the wire. The seed crystal 17 attached at the end of the seed holder 18 is immersed into the raw material melt 4, and a single crystal ingot 3 is formed below the seed crystal 17 by winding the pulling wire 16 by the pulling mechanism.

The aforementioned crucible is constituted by an inside quartz crucible 5 for directly containing the raw material melt 4 and an outside graphite crucible 6 for supporting the quartz crucible 5. The crucibles 5 and 6 are supported by a crucible rotating shaft 19 that can be rotated and moved upwardly and downwardly by a rotation drive mechanism (not shown) provided at a lower portion of the apparatus 20 for growing a single crystal. The crucibles are rotated in a direction reverse to the rotating direction of the crystal and moved upwardly for a height of melt surface lowered by decrease of the melt according to the pulling of a single crystal ingot 3, so that the height of the melt surface should be maintained constant, in order to prevent change of crystal quality with respect to change of the melt surface in the apparatus for growing a single crystal.

The heater 7 is disposed so that it should surround the crucibles 5 and 6, and a heat insulating member 8 for preventing the heat from the heater 7 from directly radiating the main chamber 1 is provided outside the heater 7 so that it should surround the heater.

Further, an inert gas such as argon gas is introduced into the chambers 1 and 2 from a gas inlet 10 provided at an upper part of the pulling chamber 2 with the purpose of discharging reaction gases generated in the furnace out of the furnace etc., passed through a space above the single crystal ingot 3 under pulling and the melt 4 to circulate inside the chambers 1 and 2, and then discharged from a gas outlet 9.

The main chamber 1 and the pulling chamber 2 are formed of a metal excellent in heat resistance and rigidity such as stainless steel, and cooled with water passing through cooling pipes (not shown). The structure of the apparatus described above is substantially the same as that of an ordinary apparatus for growing a single crystal.

In the apparatus for growing a single crystal according to the present invention, there is provided a cooling cylinder 11 composed of copper or a metal having a heat conductivity larger than that of copper, forcibly cooled by circulation of a cooling medium, extending from an upper part of the main chamber toward the raw material melt surface and cooling neighborhood of the crystal growth interface. As the cooling cylinder 11 in which the cooling medium is circulated as means for forcibly cooling a single crystal under pulling, there can be exemplified a hollow cooling cylinder 11a in a cylindrical shape having a hollow structure (refer to FIG. 1(b)) or a cooling cylinder 11b with a cooling pipe in which a cooling pipe 13 for circulating the cooling medium is wound around a cooling cylinder composed of a single solid plate (refer to FIG. 2). The hollow cooling cylinder 11a or cooling cylinder 11b with a cooling pipe extends, for example, from a ceiling of the main chamber 1 toward a raw material melt surface so as to surround a single crystal ingot 3 under pulling, and its end is disposed in the vicinity of the crystal growth interface 22.

As described above, the cooling cylinder 11 according to the present invention is forcibly cooled with the cooling medium and disposed in the vicinity of the crystal growth interface 22, i.e., at a position immediately above and close to the melt surface. In conventional cooling cylinders, the cooling medium can be circulated only at a position remote from the melt surface. However, in the present invention, a crystal immediately after the growth can be forcibly cooled by a cooling cylinder in which the cooling medium is directly circulated at a position extremely near the crystal growth interface, and thus extremely high cooling effect can be obtained.

Meanwhile, it is well known that if inside of a pulled single crystal is contaminated with heavy metal impurities such as those of copper, characteristics of devices produced by using the single crystal are degraded. Therefore, it is feared that, if a single crystal is pulled with bringing the cooling cylinder made of copper closer to the neighborhood of the crystal growth interface, the pulled single crystal may be contaminated with copper. However, if the cooling cylinder brought close to the crystal growth interface (several to several tens of millimeters from the interface) is sufficiently cooled as in this embodiment, there is no anxiety about contamination at all. The reasons for this are as follows.

That is, when a single crystal is grown by the FZ (Floating Zone) method, a high frequency dielectric heating coil made of copper (cooling water is circulated inside the coil) is used, and a raw material is melted inside the coil by high frequency dielectric heating to grow a single crystal. In this case, in spite of the growing of single crystal in a state that the raw material melt is brought close to the coil made of copper in a distance of several millimeters, such copper contamination that the device characteristics should be degraded are not detected in the produced single crystal at all. Therefore, it can be concluded as described above.

On the other hand, in the case of the invention disclosed in the aforementioned Japanese Patent Laid-open (Kokai) Publication No. 8-239291, it is possible to pull a single crystal while disposing a lower end of the cooling cylinder only of which upper portion is supplied with cooling water in the vicinity of the crystal growth interface as in the above embodiment. However, the cooling water is located at a position quite remote from the lower end of the cooling cylinder, therefore the cooling effect for the lower end becomes insufficient and its temperature is increased. This is likely to invite copper contamination, and thus it is not preferred also in view of crystal quality.

In the cooling cylinder 11 of the apparatus 20 for growing a single crystal shown in FIG. 1, a cooling medium is introduced from a cooling medium inlet 12, circulates in the cooling cylinder to forcibly cool the cooling cylinder, and then discharged to the outside. Usually, the discharged cooling medium is cooled by a heat exchanger, supplied to the cooling cylinder again and circulates through it.

Although any liquid or gas conventionally used as a cooling medium can be used as the cooling medium, it is suitable to use water in view of handling property, cost and so forth in addition to the cooling characteristics thereof. Further, by controlling flow rate and temperature of the cooling medium passing through the cooling cylinders as required, the heat quantity of the cooling cylinder to be removed can be changed, and therefore a desired cooling atmosphere according to the single crystal growth rate can be formed. Further, it is also possible to change temperature distribution in a crystal under pulling by changing winding density distribution of the cooling pipe shown in FIG. 2.

As the material of the cooling cylinder, copper or a metal having a heat conductivity larger than that of copper is used, which is particularly excellent in heat conductivity. Examples of the latter include silver, silver-copper alloys and so forth. The reasons why these copper and so forth are employed were explained in (Experiment 1) and (Experiment 2) described above. That is, the temperature of the cooling cylinder or the cooling pipe can be 100° C. or lower if they are forcibly cooled directly with water, and therefore the surface of the cooling cylinder is not melted or damaged. Further, since the experiments described above demonstrated that, even if the silicon melt is adhered to or brought into contact with the surface of the water-cooled copper cylinder or water-cooled copper pipe, the copper cylinder or copper pipe is not eroded or broken by thermal shock, the lower end of the cooling cylinder can be brought close to the neighborhood of the crystal growth interface, and thus the forced cooling effect for the growing single crystal can be exerted to the maximum extent.

Further, the cooling cylinder made of copper or the like has excellent heat resistance and, in addition, extremely high heat conductivity as described above. Therefore, after absorbing heat emitted from the single crystal ingot, it efficiently transfer the heat to the cooling medium such as water circulating through inside of the cooling cylinder, and lowers the temperature around the crystal. Thus, the cooling rate of a single crystal can be markedly improved.

Figure 2:
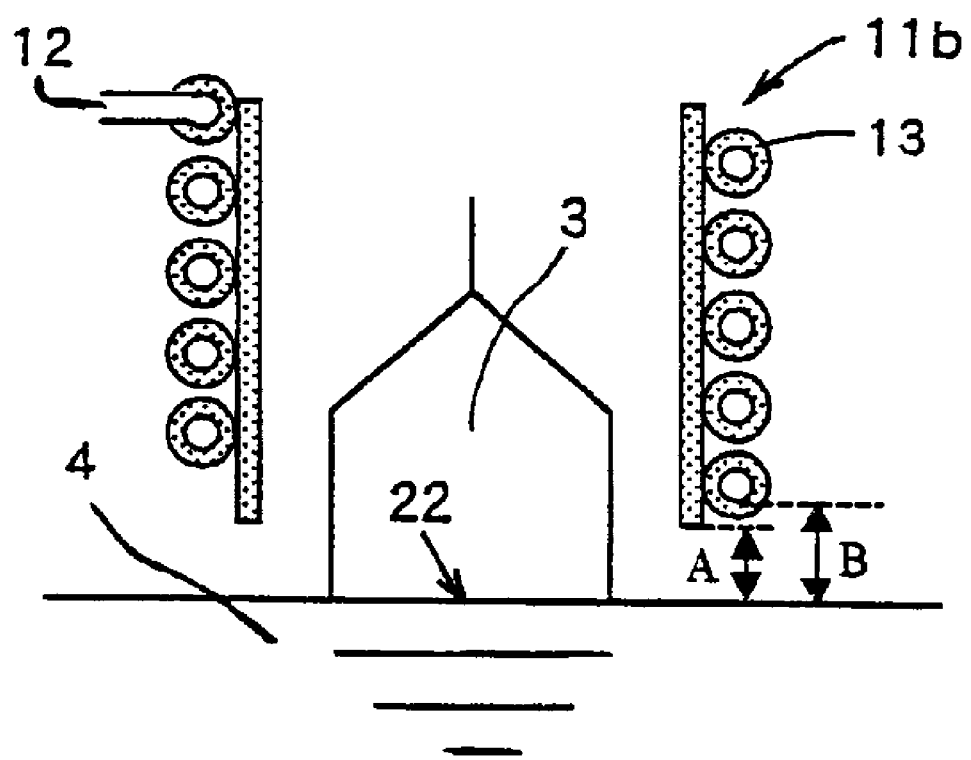
FIG. 2 is a detailed view showing details around cooling cylinder of another embodiment of the apparatus for growing a single crystal according to the present invention.

The shape of the cooling cylinder according to the present invention is not limited to those shown in the aforementioned FIGS. 1 and 2. For example, when it has the hollow structure shown in FIG. 1(b), a so-called baffle plate may also be provided in the hollow so as to enable uniform and efficient cooling. Further, when a cooling pipe is used as shown in FIG. 2, the outer surface of the cooling cylinder may be covered with a copper plate so that the cooling pipe should not be exposed on the surface. Furthermore, it is sufficient that the cooling cylinder according to the present invention has such a structure that neighborhood of the crystal growth interface should be forcibly cooled, and the total region from the neighborhood of the crystal growth interface to the ceiling of the main chamber may not be forcibly cooled. This is because the effect of improving the growth rate can be sufficiently obtained compared with conventional techniques if the neighborhood of the crystal growth interface can be forcibly cooled. Furthermore, although the cooling cylinders shown in FIGS. 1 and 2 have a cylindrical shape only in the approximately perpendicular direction, the cooling cylinder may have, for example, such a shape that the end portion should be parallel to the melt surface.

Further, the crucible and the cooling cylinder are preferably disposed so that Distance A (mm) between the lower end of the cooling cylinder made of copper or the like and the raw material melt surface and Distance B (mm) between the lower end of the cooling medium circulating in the cooling cylinder and the raw material melt surface should satisfy the relationships of $100 \geq B \geq A \geq 5$ and $B-A \leq 50$. If a single crystal is pulled with adjusting a position of the melt surface so that the relationships should be satisfied, the forced cooling effect is surely exerted, and thus the crystal growth rate can be accelerated. In addition, the end of the cooling cylinder is not damaged by the melt.

That is, the end of the cooling cylinder and the lower end of the cooling medium circulating in the cooling cylinder are preferably separated from the raw material melt surface by 5 mm or more. Although the effect of rapidly cooling the crystal is more improved as the cooling cylinder becomes closer to the melt surface, the end of the cooling cylinder may be brought into contact with the melt surface when the melt surface is vibrated, if the cooling cylinder is brought close exceeding the distance defined above. On the other hand, if it is separated by more than 100 mm, the cooling effect of the crystal is decreased, and therefore a distance of 100 mm or less is preferred. Further, the relationship of $B-A \leq 50$ is defined for the following reasons. That is, if a position where the cooling medium flows is separated from the end of the cooling cylinder by a distance more than the defined distance, the end of the cooling cylinder is not efficiently cooled and therefore the crystal cooling effect is decreased. At the same time, if the cooling cylinder is accidentally brought into contact with the melt, the end of the cooling cylinder may be partially melted and damaged. Therefore, the above relationship was defined.

Furthermore, by providing the cooling cylinder 11 in the manner described above, gas flow guide effect for inert gas such as argon that is passed through the inside of the cooling cylinder from its upper part can be increased, and cooling effect by the gas can also be obtained.

As a means for disposition of the cooling cylinder in the main chamber, while it is easy to dispose it so that it should extend from the ceiling of the main chamber 1 toward the melt surface as shown in the drawings, it may also be fixed on the side wall of the main chamber.

In the apparatus for growing a single crystal according to the present invention explained above, thermal history of a growing single crystal can be freely controlled by changing the position of the melt surface with respect to the cooling cylinder. For example, if the cooling cylinder and the melt surface are brought closer, rapid cooling effect can be obtained. Conversely, if the cooling cylinder is made remoter from the melt surface, gradual cooling effect can be obtained. Therefore, by controlling the positions of the cooling cylinder and the melt surface, it is also possible to control the aggregation temperature zone of crystal defects called grown-in defects and the temperature zone concerning the oxygen precipitation in the crystal to be in a desired region. In order to freely perform such control during the crystal growth, there may be provided a driving mechanism for moving the cooling cylinder upwardly and downwardly.

Furthermore, it is of course possible to use the apparatus of the present invention in the pulling methods under magnetic field (referred to as "MCZ method" hereafter) in which an electromagnet (not shown in the drawings) is provided outside the main chamber 1 containing the melt 4 and the single crystal 3 is grown with applying a magnetic field to the melt 4 in the chamber, and thereby a similar effect can of course be obtained. In particular, if the apparatus of the present invention is used as an apparatus for growing a single crystal by the MCZ method for the production of a large single crystal, the crystal growth rate can be more effectively improved and therefore marked improvement of productivity can be expected.

To confirm the effect of the present invention, analysis based on thermal simulation was performed by using global heat transfer analysis software, called FEMAG (F. Dupret, P. Nicodeme, Y. Ryckmans, P. Wouters and M. J. Crochet, Int. J. Heat Mass Transfer, 33, 1849 (1990)). The results are described hereafter.

(Results of Simulation)

Figure 5:
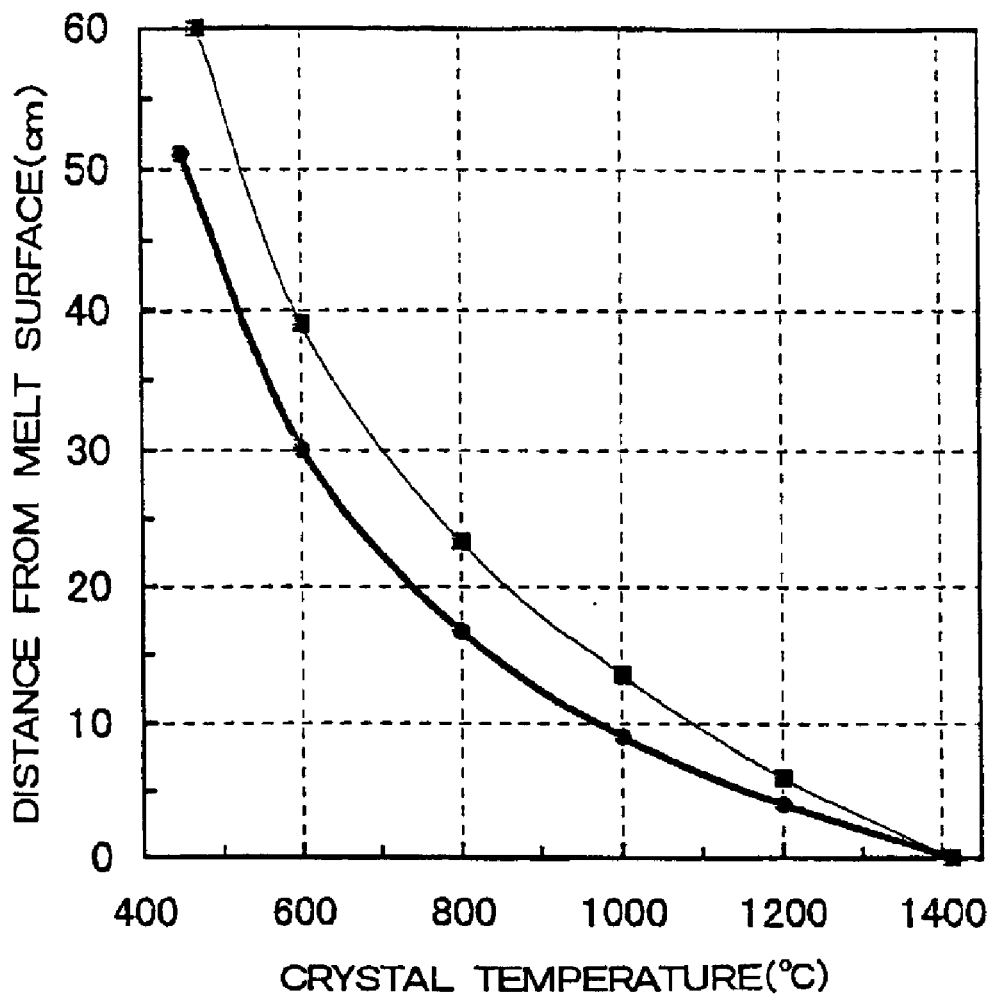
FIG. 5 is a graph showing temperature distribution along the crystal growth axis direction of a crystal having a diameter of 8 inches.

FIG. 5 shows temperature distributions of crystals under pulling having a diameter of 8 inches along the pulling axis direction, which were calculated by the simulation. The thick line represents the result for the case of using such an apparatus for growing a single crystal provided with a cooling cylinder according to the present invention as shown in FIG. 1, in which temperature of the cooling cylinder was assumed to be fixed at 30° C. and distance between a melt surface and the cooling cylinder was set to be 50 mm. On the other hand, the fine line represents the result for an HZ structure provided with a cooling cylinder only of which upper part is cooled with water and having a heat insulating material of a conventionally used particular structure at a lower part, in which distance between a melt surface and the heat insulating material was set to be 17 mm.

From the results shown in FIG. 5, it can be seen that the structure of the present invention exerts markedly higher cooling effect compared with the conventional structure. Further, the temperature gradient G (K/cm) of the crystal under pulling in the neighborhood of the crystal growth interface between the melting point and 1400° C. is calculated to be 52.3 (K/cm) at the crystal center for the structure of the present invention, which was markedly larger than the value for the conventional structure, 36.6.

FIG. 6 is a graph showing a relationship of the aforementioned temperature gradient G and the maximum pulling rate (actually measured value) of a crystal (diameter: 8 inches) as a product that can be produced in a large scale for the case of using an apparatus for growing a single crystal having a conventionally used HZ structure. In FIG. 6, the black circles and white circles represent plots of values experimentally obtained without application of magnetic field or with application of magnetic field, respectively. From the approximation lines connecting each plot, it was found that high speed pulling could be expected to be possible at a rate of about 2.0 mm/min without application of magnetic field or about 2.7 mm/min with application of magnetic field, if the structure of the present invention (G=52.3 K/cm) is used.

The present invention will be explained more specifically with reference to the following working examples and comparative examples. However, the present invention is not limited to these.

EXAMPLE 1

A silicon single crystal ingot was grown by the MCZ method using the apparatus 20 for growing a single crystal shown in FIG. 1 provided with an electromagnet (not shown in the drawing) outside the main chamber 1. The cooling cylinder 11 was a hollow cooling cylinder 11a, of which material was copper, and water was used as a cooling medium. The end of the cooling cylinder 11 was brought close to the melt surface so that the distance separating them should be 20 mm to perform the operation. On the other hand, a magnetic field was applied to the silicon melt 4 so that the magnetic field strength at the center of horizontal magnetic field should be 4000 G, and a hot zone that could contain a crucible having a diameter of 24 inches was used.

An amount of 150 kg of polycrystal silicon raw material was introduced into the crucible having a diameter of 24 inches, and a single crystal having a diameter of 8 inches (200 mm) and a length of constant diameter portion of about 100 cm was grown. As a result, a silicon single crystal in an approximately cylindrical shape could be obtained at an average pulling rate of 2.6 mm/min for the constant diameter portion of the single crystal without any deformation.

When a long length single crystal having a similar size is pulled, the average pulling rate is usually about 1.8 mm/min at most for a diameter of 8 inches. Therefore, compared with this rate, the average pulling rate was markedly increased.

EXAMPLE 2

Then, by using the same apparatus as in Example 1, 150 kg of polycrystal silicon raw material was introduced into its crucible having a diameter of 32 inches, and a single crystal having a diameter of 12 inches (300 mm) and a length of constant diameter portion of about 45 cm was grown. As a result, a silicon single crystal in an approximately cylindrical shape could be obtained at an average pulling rate of 1.6 mm/min for the constant diameter portion of the single crystal without any deformation. This means that there was achieved a pulling rate about 2 times of the pulling rate obtained in Comparative Example 2.

COMPARATIVE EXAMPLE 1

Single crystals were grown under the same conditions as used in Example 1 except that used was an apparatus for growing a single crystal in which a graphite cylinder was suspended from the ceiling of the main chamber in which any cooling medium was not circulated instead of the cooling cylinder of the apparatus for growing a single crystal used in the aforementioned example. The lengths of the grown single crystals were also approximately the same as the lengths pulled in the example. As a result, although single crystals in an approximately cylindrical shape can be grown without crystal deformation at an average pulling rate of 1.8 mm/min or less for the constant diameter portion, any single crystal could not be normally grown at a pulling rate higher than the above level, because there were caused problems, for example, crystal was deformed during the growth, slip dislocations were generated and so forth.

COMPARATIVE EXAMPLE 2

Then, by using the same apparatus as used in Comparative Example 1, a single crystal having a diameter of 12 inches (300 mm) and a length of constant diameter portion of about 45 cm was grown. As a result, although single crystals in an approximately cylindrical shape can be grown without crystal deformation at an average pulling rate of 0.8 mm/min or less for the constant diameter portion, any single crystal could not be normally grown at a pulling rate higher than the above level, because there were caused problems, for example, crystal was deformed during the growth, slip dislocations were generated and so forth.

The present invention is not limited to the embodiments described above. The above-described embodiments are mere examples, and those having the substantially same structure as that described in the appended claims and any providing similar functions and advantages are included in the scope of the present invention.

For example, while the apparatus of the present invention was explained by exemplifying an apparatus for growing a single crystal by the CZ method in which a single crystal is grown without applying a magnetic field and an apparatus for growing a single crystal by the HMCZ method in which a single crystal is grown with applying a horizontal magnetic field to the melt, similar effect can of course be obtained in apparatuses for growing a single crystal utilizing other magnetic fields including cusp magnetic field, vertical magnetic field and so forth.

What is claimed is:

1. A method for growing a single crystal by the Czochralski method, wherein a single crystal is grown with forced cooling of neighborhood of a crystal growth interface by disposing a cooling cylinder formed of copper or a metal having a heat conductivity larger than that of copper at least in the vicinity of the crystal growth interface so as to surround the single crystal under pulling, circulating a cooling medium in the cooling cylinder and making the cooling medium and the raw material melt closer resulting in that the cooling medium reaches the raw material melt when the crucible is elevated to the maximum height.

2. The method for growing a single crystal according to claim 1, wherein the single crystal is pulled with adjusting a position of the melt surface so that Distance A (mm) between a lower end of the cooling cylinder and the raw material melt surface and Distance B (mm) between a lower end of the cooling medium circulating in the cooling cylinder and the raw material melt surface should satisfy a relationship of $100 \geq B \geq A \geq 5$.

3. The method for growing a single crystal according to claim 2, wherein Distance A and Distance B satisfy a relationship of $B-A \leq 50$.

4. An apparatus for growing a single crystal based on the Czochralski method comprising at least a main chamber enclosing a crucible for containing a raw material melt and a heater for heating the raw material melt, a pulling chamber continuously provided above the main chamber, into which a grown single crystal is pulled and stored, and a cooling cylinder surrounding the single crystal under pulling, wherein at least the cooling cylinder is composed of copper or a metal having a heat conductivity larger than that of copper, is forcibly cooled by circulating a cooling medium in the cooling cylinder, and extends from an upper portion of the main chamber toward a raw material melt surface so as to cool neighborhood of a crystal growth interface by making the cooling medium and the raw material melt closer resulting in that the cooling medium reaches the raw material melt when the crucible is elevated to the maximum height.

5. The apparatus for growing a single crystal according to claim 4, wherein the cooling cylinder has a hollow structure for circulation of the cooling medium, or consist of a solid cooling cylinder wound with a cooling pipe for circulation of the cooling medium.

6. The apparatus for growing a single crystal according to claim 4, wherein the cooling medium is water.

7. The apparatus for growing a single crystal according to claim 5, wherein the cooling medium is water.

8. The apparatus for growing a single crystal according to claim 4, wherein Distance A (mm) between the lower end of the cooling cylinder and the raw material melt surface and Distance B (mm) between a lower end of the cooling medium circulating in the cooling cylinder and the raw material melt surface satisfy a relationship of $100 \geq B \geq A \geq 5$ during pulling of the crystal.

9. The apparatus for growing a single crystal according to claim 5, wherein Distance A (mm) between the lower end of the cooling cylinder and the raw material melt surface and Distance B (mm) between a lower end of the cooling medium circulating in the cooling cylinder and the raw material melt surface satisfy a relationship of $100 \geq B \geq A \geq 5$ during pulling of the crystal.

10. The apparatus for growing a single crystal according to claim 6, wherein Distance A (mm) between the lower end of the cooling cylinder and the raw material melt surface and Distance B (mm) between a lower end of the cooling medium circulating in the cooling cylinder and the raw material melt surface satisfy a relationship of $100 \geq B \geq A \geq 5$ during pulling of the crystal.

11. The apparatus for growing a single crystal according to claim 7, wherein Distance A (mm) between the lower end of the cooling cylinder and the raw material melt surface and Distance B (mm) between a lower end of the cooling medium circulating in the cooling cylinder and the raw material melt surface satisfy a relationship of $100 \geq B \geq A \geq 5$ during pulling of the crystal.

12. The apparatus for growing a single crystal according to claim 8, wherein Distance A and Distance B satisfy a relationship of $B-A \leq 50$.

13. The apparatus for growing a single crystal according to claim 9, wherein Distance A and Distance B satisfy a relationship of $B-A \leq 50$.

14. The apparatus for growing a single crystal according to claim 10, wherein Distance A and Distance B satisfy a relationship of $B-A \leq 50$.

15. The apparatus for growing a single crystal according to claim 11, wherein Distance A and Distance B satisfy a relationship of $B-A \leq 50$.

\* \* \* \* \*